United States Patent [19]

Ueda et al.

[11] Patent Number: 5,366,587
[45] Date of Patent: Nov. 22, 1994

[54] PROCESS FOR FABRICATING MICROMACHINES

[75] Inventors: Minoru Ueda; Michitomo Iiyama, both of Osaka, Japan

[73] Assignee: Sumitomo Electric Industries, Ltd., Osaka, Japan

[21] Appl. No.: 887,749

[22] Filed: May 26, 1992

[30] Foreign Application Priority Data

May 24, 1991 [JP] Japan .................................. 3-149461
May 24, 1991 [JP] Japan .................................. 3-149462
May 24, 1991 [JP] Japan .................................. 3-149463

[51] Int. Cl.$^5$ .......................................... H01L 21/306
[52] U.S. Cl. .................... 156/651; 156/643; 156/653; 156/657; 310/309; 505/785
[58] Field of Search ............... 156/643, 645, 651, 652; 310/40 MM, 309; 505/778, 785, 825

[56] References Cited

U.S. PATENT DOCUMENTS

| 4,851,080 | 7/1989 | Howe et al. | 156/657 |
| 4,943,750 | 7/1990 | Howe et al. | 310/309 |
| 4,997,521 | 3/1991 | Howe et al. | 156/651 |
| 5,043,043 | 8/1991 | Howe et al. | 156/651 |
| 5,180,940 | 1/1993 | Paratte et al. | 310/40 MM |

OTHER PUBLICATIONS

Mehregany et al, "Integrated Fabrication of Polysilicon Mechanisms", Jun. 1988, pp. 719–723.

*Primary Examiner*—Anthony McFarlane
*Attorney, Agent, or Firm*—Foley & Lardner

[57] ABSTRACT

A process for manufacturing a micromachine comprising a machine element supported on a substrate, comprising the steps of successively depositing on the substrate machine part layers and removable sacrificial layers made of an oxide ceramic material containing a rare earth, Ba, and Cu, and selectively removing the machine parts layer and the sacrificial layers so as to leave the machine element.

20 Claims, 3 Drawing Sheets

PROCESS FOR FABRICATING MICROMACHINES

BACKGROUND OF THE INVENTION

1. Field of the Invention

The present invention relates to an improvement in a process for fabricating "micromachines", more particularly to a novel ceramic material used in the process.

2. Description of the Related Art

The "micromachine" is an extremely small machine having dimensions or several tens micrometers to several hundreds micrometers and fabricated by such precise processing techniques that are used in the field of integrated circuits manufacturing or the like. Many studies have been made for fabricating the micromachines.

In order to facilitate understanding of the present invention, it may be useful to describe, at first, a known process for fabricating a micro gear having a dimension of about several tens to several hundreds micrometers to which the present invention is advantageously applicable with reference to FIG. 1.

BRIEF DESCRIPTION OF DRAWINGS

FIG. 1 comprises FIGS. 1A through 1J.

FIG. 1 illustrates successive steps of a known process for fabricating a microgear made of polycrystalline silicon rotatable-supported about a fixed shaft secured to a substrate.

Figure 1A:
FIG. 1A to 1J are cross sectional views illustrating successive steps for fabricating a micromachine to which the present invention is applicable.

In the process shown in FIG. 1, a layer 2 of $Si_3N_4$ is deposited firstly on a substrate 1 made of silicon single crystal (Si substrate) by low-pressure chemical vapour deposition (CVD) technique (FIG. 1A).

The layer 2 of $Si_3N_4$ is patterned (FIG. 1B) in such a manner that a first flange portion 2' is left. This patterning operation can be effected by usual photo-lithography technique followed by partial removal of the $Si_3N_4$ layer by means of reactive ion-etching (RIE).

Figure 1B:
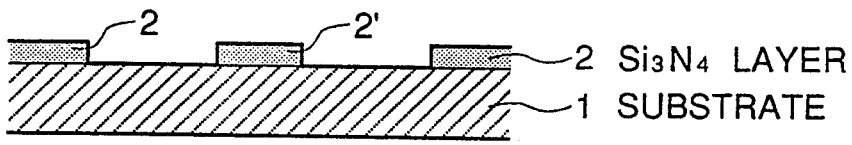
Figure 1C:
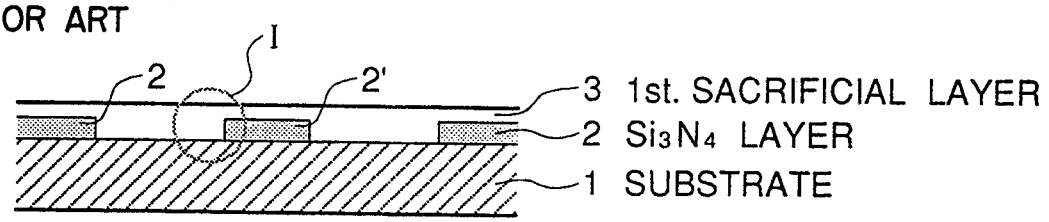

Then, a first sacrificial layer 3 made of phosphor silicate glass (PSG) is deposited by CVD technique (FIG. 1C).

Figure 1D:
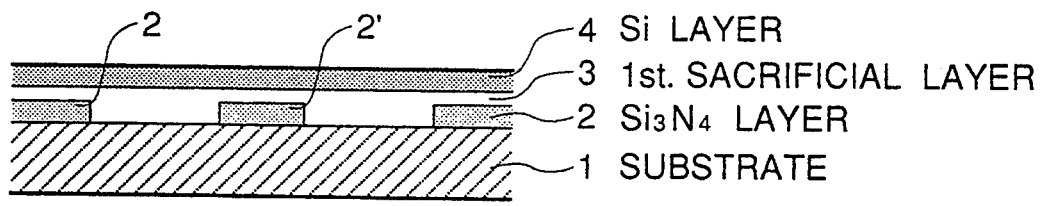

On the PSG layer 3, a layer 4 made of polycrystalline silicon (Si layer) is deposited by low-pressure CVD technique (FIG. 1D). A microgear (14) will be produced in this Si layer in the latter stage.

Figure 1E:
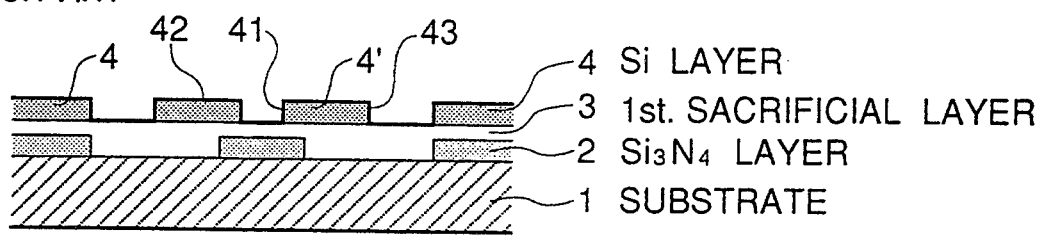

The Si layer 4 is then patterned in such a manner that a gear portion 4' having a central hole 41, a top surface 42 and an outer periphery 43 is left just above the first flange portion 2' and the PSG layer 3 is partly exposed (FIG. 1E). This patterning operation can be carried out by usual photo-lithography technique followed by partial removal of the Si layer by means of RIE.

Figure 1F:
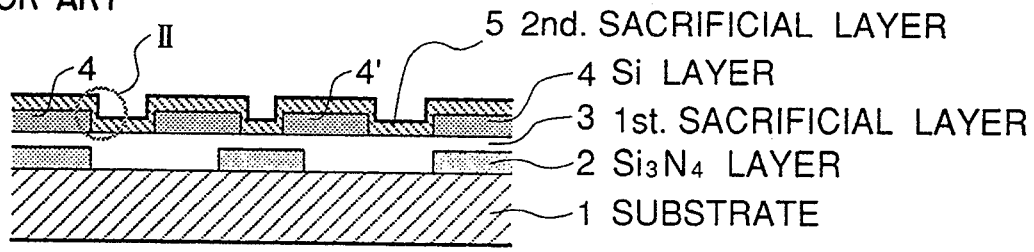

Then, a second sacrificial layer 5 made of silicon nitride ($SiN_x$ layer) is deposited whole over exposed surfaces including the top surface 42 and surfaces of the central hole 41 and the outer periphery 43 of the gear portion 4' by plasma CVD technique (FIG. 1F).

Figure 1G:
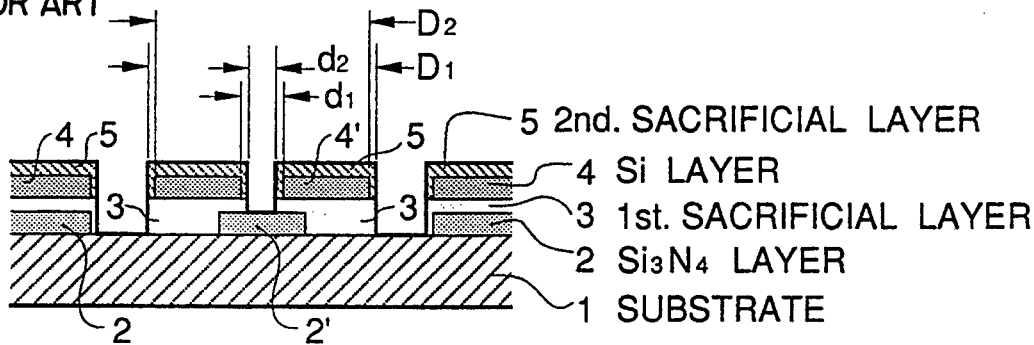

The second sacrificial layer 5 is then patterned in such a manner that a top surface of the first flange 2' is exposed while all of the top surface 42, the central hole 41 and the outer periphery 43 of the gear 4' are covered or protected with the second sacrificial layer 5 (FIG. 1G). This patterning can be effected by usual photo-lithography technique followed by partial removal of the second sacrificial layer 5 by means of RIE.

FIG. 1G shows also relative dimensions (a diameter $d_1$ of the central hole 41, a diameter $d_2$ to be drilled in the central hole 41, an outer diameter $D_1$ of a portion to be left of the first sacrificial layer 3 and an inner diameter $D_2$ of a hole to be drilled in the first and second sacrificial layers 3 and 5).

Figure 1H:
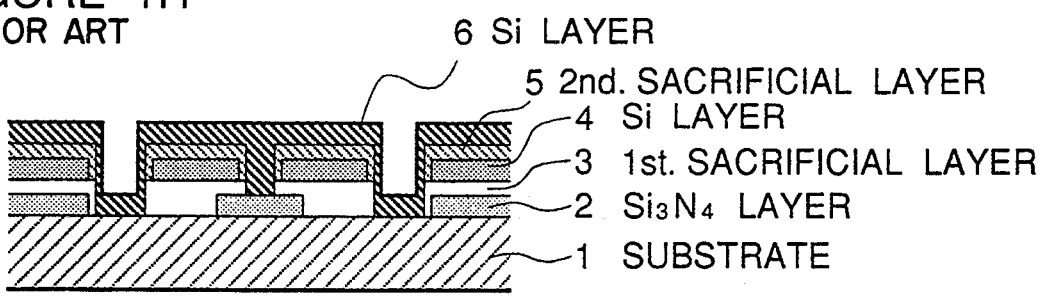

Then, a layer 6 made of polycrystalline silicon (Si layer) is deposited thereon by low-pressure CVD (FIG. 1H). From this Si layer 6, a shaft (16) will be produced in the later stage.

Figure 1I:
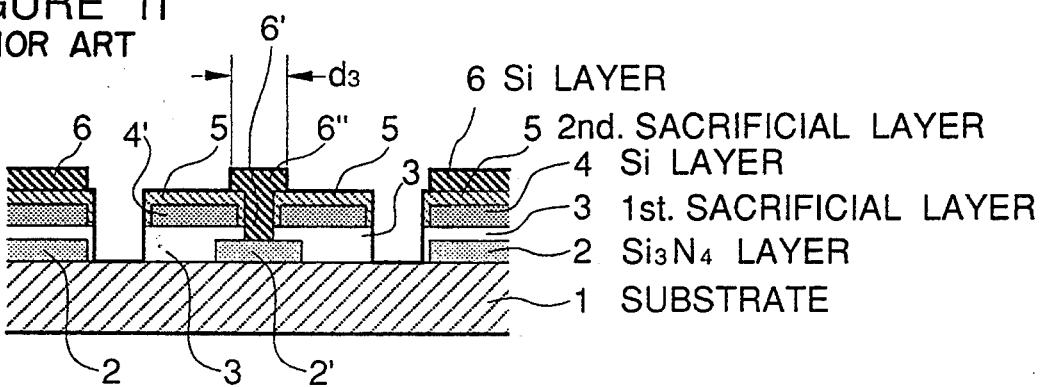

After then, the polycrystalline silicon layer 6 is patterned in such a manner that a shaft portion 6' and a second flange portion 6" are left in the central hole 41 (FIG. 1I). This patterning can be effected by usual photo-lithography technique followed by partial removal of the Si layer 6 by means of RIE. FIG. 1I shows also a dimension of the second flange portion 6" ($d_3 > d_2$).

Figure 1J:
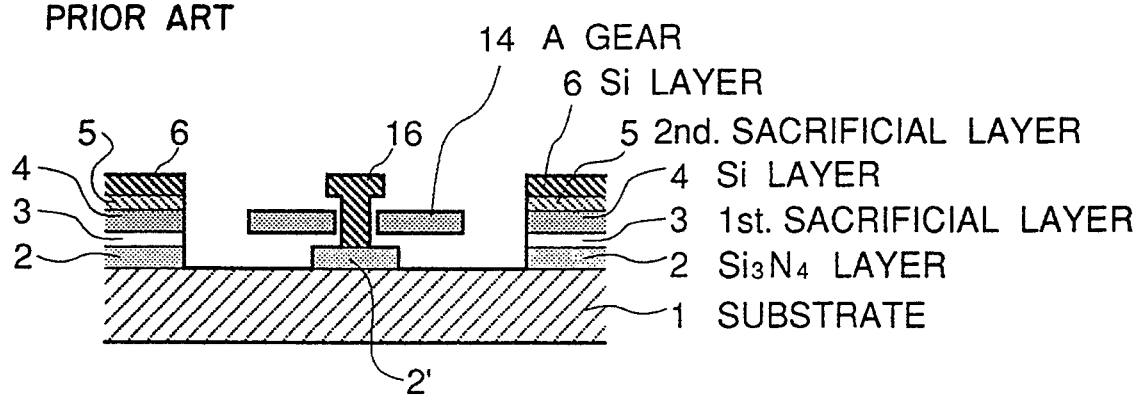

Finally, the first sacrificial layer (PSG) 3 and the second sacrificial layer ($SiN_x$) 5 are etched with aqueous solution of hydrogen fluoride (HF) (FIG. 1J). By this etching operation, all of the first sacrificial layer (PSG) 3 and the second sacrificial layer ($SiN_x$) 5 left are removed to produce a microgear 14 made of polycrystalline silicon rotatable-supported about a shaft 16 consisting of flanges 2' and 6" and a shaft portion 6' made of polycrystalline silicon.

In the process for fabricating the micromachines illustrated in FIG. 1, successive deposition steps of different materials each followed by the patterning operation are required. Portions of the sacrificial layers around the fabricated microgear 14 not previously removed in the process can be removed at the ultimate stage or can be left as they are.

A merit of this process resides in that planarity of the microgear can be assured by using the sacrificial layers.

These sacrificial layers 3 and 5 surrounding the gear 4' must be removed selectively and hence must be made of such materials that can be removed easily and selectively.

In addition to this property, each of the sacrificial layer 3 and 5 must have a smooth flat surface. The flatness is required especially in such a case that another machine element is fabricated on the sacrificial layers.

Still more, the sacrificial layers 3, 5 must have adequate adhesive property to an under-layer and good processability.

In the prior arts, the sacrificial layers 3 and 5 are made of phosphor silicate glass (PSG) and silicon nitride ($SiN_x$) respectively.

It is apparent that performance of micromachine fabricated is critically influenced by the property of the sacrificial layers. In other words, improved sacrificial layers are required in order to produce micromachines of high performance.

An object of the present invention is to provide a novel material for the sacrificial layers which are suitable for fabricating micromachines.

SUMMARY OF THE INVENTION

The present invention provides a process for fabricating a micromachine comprising a substrate and at least one movable machine element supported moveably relative to the substrate, by depositing machine parts layers and removable sacrificial layers successively in a predetermined order on the substrate and removing the machine parts layers and removable sacrificial layers selectively so as to leave the machine element, characterized in that at least one of the sacrificial layers is made of an oxide ceramic material containing rare earth, Ba and Cu.

Compositions of the oxide ceramic material containing rare earth, Ba and Cu of Re-Ba-Cu-O (in which Re stands for rare earth elements such as Y, Dy and Ho) used in the present invention can be selected in a wide range and depend on fabrication methods used and applications or uses. In other words, in the oxide ceramic material according to the present invention, there is no special limitation in proportions among rare earth, Ba, Cu and O and in the crystal structure.

The oxide ceramic material can be made of an oxide represented by the general formula:

$$Re_1Ba_2Cu_3O_{7-x}$$

in which Re stands for rare earth elements and x is a number of $\pm 1$.

The ceramic material of Re-Ba-Cu-O used in the present invention is soluble in acid of low concentration, so that the sacrificial layers deposited on a silicon substrate can be removed selectively and easily. In fact, the oxide ceramic material alone can be removed or etched selectively at a rule of 1 $\mu$m/min with aqueous solution of hydrogen chloride (concentration of 1/1000) without spoiling dimensional precision of the resulting machine element made of polycrystalline silicon because silicon is hardly soluble in the acid solution of this concentration.

The ceramic material for the sacrificial layers may be prepared by spray deposition technique which has such a merit that so-called "step coverage" is improved. Another merit of the spray deposition technique resides in that holes can be filled up so that unevenness of an under-layer is absorbed to produce a smooth planar sacrificial layer.

Still more, since the ceramic materials often possess two dimensional crystal structure, the sacrificial layer made of ceramic material shows good crystallinity and hence has a smooth planar surface.

In addition, the ceramic materials can be easily processed by dry etching technique such as argon ion milling and reactive ion etching (RIE). Therefore, the sacrificial layers made of such ceramic material can be machined precisely by the dry etching technique.

Each of the sacrificial layers consists of a single layer or a plurality of sub-layers. In the latter case, following variations or combinations of the sub-layers are preferably used:

(1) First Variation

A top sub-layer and/or a bottom sub-layer in each sub-sacrificial layer are/is made of the oxide ceramic material containing rare earth, Ba and Cu. The other sub-layers other than the top sub-layer and bottom sub-layer can be made of silicon nitride ($SiN_x$) or phosphor silicate glass (PSG).

A merit of this first variation resides in that the top and/or bottom sub-layer can be prepared in a form of a thin film in a sacrificial layer and hence can be prepared easily at the almost same manufacturing cost as known materials.

Still more, when the top sub-layer is made of the ceramic material, etching liquid penetrate quickly into the sacrificial layer, so that total sub-layers are dissolved quickly. When the bottom sub-layer is made of the ceramic material, the bottom sub-layer is etched firstly, so that the sacrificial layer can be totally removed before the other sub-layers are dissolved.

(2) Second Variation

A top sub-layer and a bottom sub-layer in each sacrificial sub-layer are made of a material which give no bad influence to materials of which the substrate and the machine element are made such as silicon nitride ($SiN_x$) and phosphor silicate glass (PSG) which are the conventional materials, while at least one of intermediate sub-layers in each sub-sacrificial layer is made of the oxide ceramic material containing rare earth, Ba and Cu. In this case, the intermediate sub-layers made of the oxide ceramic material is etched firstly so that the total of sub-sacrificial layers can be removed before the sacrificial layers are totally dissolved.

A merit of this second variation resides in that the top sub-layer and the bottom sub-layer show improved lattice-matching with an under-layer and with machine elements to be deposited thereon in addition to that undesirable influence due to mutual diffusion or migration can be minimized.

The movable machine element can be made of polycrystalline silicon which can be deposited by low-pressure chemical vapour deposition (CVD) technique.

The movable machine element can be supported rotatable by a stationary shaft made of polycrystalline silicon and secured to the substrate. The movable machine element can be a slider supported by a stationary shaft made of polycrystalline silicon in such a manner that the slider can move along a horizontal axis or a vertical axis with respect to the substrate.

The stationary shaft has preferably flanges at opposite ends, the flanges can be made of polycrystalline silicon.

The movable machine element can be a microgear, a micro cantilever, a micro rotor, micro slider, a micro valve or the other parts having dimensions of several tens to several hundreds microns. These machine parts may be separated from the substrate and mounted or assembled on another substrate.

The machine parts layers and removable sacrificial layers can be prepared by any known deposition techniques including the spray deposition technique, low-pressure chemical vapour deposition (CVD), plasma CVD and sputtering. The most suitable deposition technique can be used for each of these layers.

The machine parts layers and removable sacrificial layers can be removed selectively by any known removal technique. Usually, photolithography followed by RIE is preferably used.

The substrate is preferably a silicon single crystal substrate.

The process according to the present invention permits to fabricate micromachines of high precision owing to the sacrificial layer of oxide ceramic material Re-Ba-Cu-O. Namely, the ceramic material for the sacrificial layer can be removed easily at high selectivity in comparison with the conventional PSG and silicon nitrides, so that a smooth planar layer can be prepared with improved processability. Therefore, machine elements fabricated by using the sacrificial layer according to the present invention have improved high precision because dimensional precision can be maintained during the removal stage of the sacrificial layers.

DESCRIPTION OF THE PREFERRED EMBODIMENTS

Now, the present invention will be described with reference to preferred embodiments, but the scope of the present invention should not be limited thereto.

EXAMPLE 1

A micromachine was fabricated by using two sacrificial layers each made of $Y_1Ba_2Cu_3O_{7-x}$ by a process according to the present invention.

The structure is almost same as the prior art which is explained with reference to FIG. 1 except the sacrificial layers. Therefore, differences from the prior an are mainly described hereinafter.

In the process according to the present invention, after the layer 2 of $Si_3N_4$ was deposited, a first sacrificial layer 3 made of $Y_1Ba_2Cu_3O_{7-x}$ was formed (FIG. 1C) by spray deposition technique with a nitric acid solution in which $Y_2O_3$, $BaCO_3$ and $CuO$ were dissolved under following conditions:

| | |
|---|---|
| Spraying gas: | $N_2$ gas |
| Substrate temperature: | 180° C. (drying) |
| | 500° C. for 2 hours (baking) |
| Pressure: | 5 kg/cm$^2$ |
| Film thickness: | 1,000 to 3,000 nm |

Observation by a scanning electron microscopy (SEM) revealed that the resulting first sacrificial layer 3 of $Y_1Ba_2Cu_3O_{7-x}$ has a smooth surface whose maximum roughness is about 0.1 μm.

In the prior art, a first sacrificial layer 3 made of PSG formed on the same substrate showed the maximum roughness of more than 0.1 μm.

Then, polycrystalline silicon layer 4 was deposited by low-pressure CVD technique (FIG. 1D).

The polycrystalline silicon layer 4 was patterned by lithography followed by RIE (FIG. 1E).

Then, second sacrificial layer 5 made of $Y_1Ba_2Cu_3O_{7-x}$ was formed (FIG. 1F) by spray deposition technique with a nitric acid solution in which $Y_2O_3$, $BaCO_3$ and $CuO$ were dissolved under following conditions:

| | |
|---|---|
| Spraying gas: | $N_2$ gas |
| Substrate temperature: | 180° C. (drying) |
| | 500° C. for 2 hours (baking) |
| Pressure: | 5 kg/cm$^2$ |
| Film thickness: | 1,000 to 3,000 nm |

Observation by a scanning electron microscopy revealed that the resulting second sacrificial layer 3 of $Y_1Ba_2Cu_3O_{7-x}$ also has a smooth surface.

Then, the second sacrificial layer 5 was patterned with photo-resist by lithography and then was partly removed by RIE (FIG. 1G).

Then, polycrystalline silicon layer 6 was deposited thereon by low-pressure CVD technique (FIG. 1H). A photo-resist layer is formed and then is patterned by lithography. After then, the polycrystalline silicon layer 6 was partly removed by RIE technique (FIG. 1I).

Finally, the first sacrificial layer 3 and the second sacrificial layer 5 were etched with aqueous solution of hydrogen chloride (1/1000) (FIG. 1J) to produce a microgear 14 made of polycrystalline silicon rotatable- supported about a shaft 16 made of polycrystalline silicon.

Observation by a scanning electron microscopy of the micromachine obtained revealed such a fact that no erosion of edges was found in a machine element fabricated by the process according to the present invention, while edges of a machine element fabricated by the prior art were etched and rounded.

EXAMPLE 2 (FIRST VARIATION)

A micromachine was fabricated on a silicon substrate by using sub-sacrificial layers made of $Y_1Ba_2Cu_3O_{7-x}$ as a top sub-layer and a bottom sub-layer in each of two sacrificial layers by the first variation of the present invention.

The structure and successive steps are almost same as the prior art which is explained with reference to FIG. 1 except the sacrificial layer. Therefore, differences from the prior art are mainly described hereinafter.

Figure 2A:
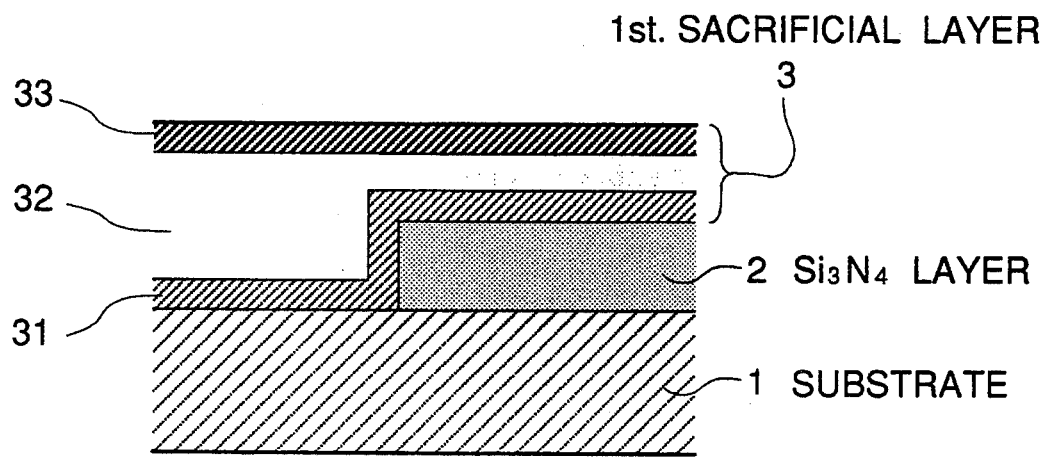
FIG. 2A and 2B are enlarged cross sectional views each corresponding to a circle I of FIG. 1C and a circle II of FIG. 1F

In the process according to this Example 2, after the layer 2 of $Si_3N_4$ was deposited at a stage of FIG. 1B, a first sacrificial layer 3 was formed as is shown in FIG. 1C. FIG. 2A illustrates an enlarged cross section of a part circled by I in FIG. 1C.

In this Example 2, the first sacrificial layer 3 consisted of three sub-layers of a lower sub-layer 31 made of $Y_1Ba_2Cu_3O_{7-x}$, an intermediate sub-layer 32 made of PSG and an upper sub-layer 33 made of $Y_1Ba_2Cu_3O_{7-x}$. These sub-layers 31, 32, 33 were prepared as following:

The lower sub-layer 31 made of $Y_1Ba_2Cu_3O_{7-x}$ was deposited on the patterned $Si_3N_4$ layer 2 and on the silicon substrate 1 by sputtering under following conditions:

| | |
|---|---|
| Sputtering gas: | Ar, $O_2$ |
| Substrate temperature: | 630° C. |
| Pressure: | 30 to 50 m Torr |
| Film thickness: | 100 nm |

The PSG sub-layer 32 was deposited by CVD under following conditions:

| | |
|---|---|
| Material gases: | $SiH_4$, $O_2$, $PH_3$ |
| Substrate temperature: | 420° C. |
| Film thickness: | 600 nm |

The upper sub-layer 33 made of $Y_1Ba_2Cu_3O_{7-x}$ was deposited by sputtering under following conditions:

| | |
|---|---|
| Sputtering gas: | Ar, $O_2$ |
| Substrate temperature: | 650° C. |
| Pressure: | 30 to 50 m Torr |
| Film thickness: | 100 nm |

Observation by a scanning electron microscopy revealed that the resulting first sacrificial layer 3 of $Y_1Ba_2Cu_3O_{7-x}$ (a surface of $Y_1Ba_2Cu_3O_{7-x}$ sub-layer 33) has such a smooth surface that average roughness is about 50 Å and the maximum roughness is about 100 Å.

In the prior art, a first sacrificial layer 3 made of PSG alone formed on the same substrate showed the maximum roughness of more than 0.1 μm.

Then, a polycrystalline silicon layer 4 was deposited by low-pressure CVD technique (FIG. 1D).

The polycrystalline silicon layer 4 was patterned by lithography followed by RIE technique (FIG. 1E).

Figure 2B:
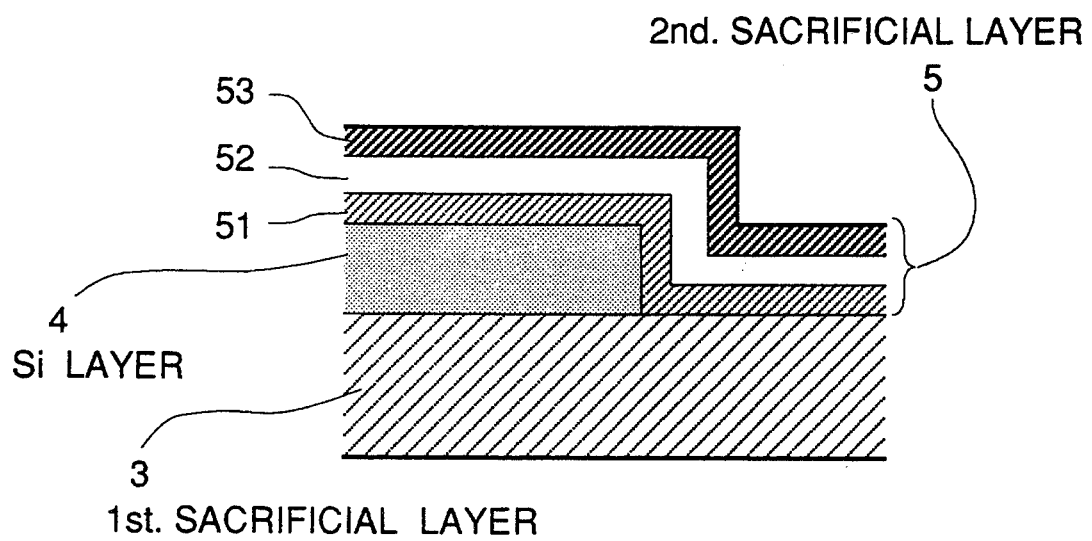

Then, a second sacrificial layer 5 was formed as is shown in FIG. 1F. FIG. 2B illustrates an enlarged cross section of a part circled by II in FIG. 1F.

In the Example 2, the second sacrificial layer 5 consisted of three layers of a lower sub-layer 51 made of $Y_1Ba_2Cu_3O_{7-x}$, an intermediate sub-layer 52 made of $SiN_x$ and an upper sub-layer 53 made of $Y_1Ba_2Cu_3O_{7-x}$. These sub-layers 51, 52, 53 were prepared as following:

The lower sub-layer 51 made of $Y_1Ba_2Cu_3O_{7-x}$ was deposited on the processed polycrystalline silicon layer 4 and on the sacrificial layer 3 by sputtering under following conditions:

| | |
|---|---|
| Sputtering gas: | Ar, $O_2$ |
| Substrate temperature: | 650° C. |
| Pressure: | 30 to 50 m Torr |
| Film thickness: | 100 nm |

The $SiN_x$ sub-layer 52 was deposited by plasma CVD under following conditions:

| | |
|---|---|
| Material gases: | $SiH_4$, $NH_3$, $N_2$ |
| Substrate temperature: | 350° C. |
| Pressure: | 200 m Torr |
| Film thickness: | 800 nm |

The upper sub-layer 53 made of $Y_1Ba_2Cu_3O_{7-x}$ was deposited by sputtering under following conditions:

| | |
|---|---|
| Sputtering gas: | Ar, $O_2$ |
| Substrate temperature: | 650° C. |
| Pressure: | 30 to 50 m Torr |
| Film thickness: | 100 nm |

Observation by a scanning electron microscopy revealed that the resulting second sacrificial layer 5 (a surface of $Y_1Ba_2Cu_3O_{7-x}$ sub-layer 53) also has a smooth surface.

Then, the second sacrificial layer 5 was pattered by lithography and was partly removed by RIE technique (FIG. 1G).

Then, polycrystalline silicon layer 6 was deposited thereon by low-pressure CVD technique (FIG. 1H). A photo-resist layer is formed and then is patterned by lithography. After then, the polycrystalline silicon layer 6 was partly removed by RIE technique (FIG. 1I).

Finally, the first sacrificial layer 3 and the second sacrificial layer 5 were etched with aqueous solution of hydrogen chloride (1/1000) as is shown in FIG. 1J to produce a microgear 14 made of polycrystalline silicon rotatable-supported about a shaft 16 made of polycrystalline silicon.

Observation by a scanning electron microscopy revealed such a fact that no erosion or corrosion at edges was found in the resulting machine element fabricated by the process according to the present invention, while edges of a machine element fabricated by the prior art were etched and rounded.

Although the $SiN_x$ sub-layer in the sacrificial layers in the Example 2 was prepared by CVD, this sub-layer can be prepared by any known technique such as sputtering.

EXAMPLE 3

A micromachine was fabricated on a silicon substrate by using three sub-sacrificial layers including an intermediate sub-layer made of $Y_1Ba_2Cu_3O_{7-x}$ by the process according to the present invention.

The structure and successive steps are almost same as the prior art which is explained with reference to FIG. 1 except the sacrificial layers. Therefore, differences from the prior art are mainly described hereinafter.

In this Example 3, after the layer 2 of $Si_3N_4$ was deposited at a stage of FIG. 1B, a first sacrificial layer 3 was formed as is shown in FIG. 1C. FIG. 2A illustrates an enlarged cross section of a pan circled by I in FIG. 1C.

In the Example 3, first sacrificial layer 3 consisted of three sub-layers of a lower sub-layer 31 made of PSG, an intermediate sub-layer 32 made of $Y_1Ba_2Cu_3O_{7-x}$, and an upper sub-layer 33 made of PSG. The first sacrificial layer consisting of three sub-layers 31, 32, 33 was prepared as following:

The lower PSG sub-layer 31 was deposited on the patterned $Si_3N_4$ layer 2 and on the silicon substrate 1 by CVD under following conditions:

| | |
|---|---|
| Material gases: | $SiH_4$, $O_2$, $PH_3$, |
| Substrate temperature: | 420° C. |
| Film thickness: | 600 nm |

The intermediate sub-layer 32 made of $Y_1Ba_2Cu_3O_{7-x}$ was deposited by sputtering under following conditions:

| | |
|---|---|
| Sputtering gas: | Ar, $O_2$ |
| Substrate temperature: | 650° C. |
| Pressure: | 30 to 50 m Torr |
| Film thickness: | 100 nm |

The upper PSG sub-layer 33 was deposited by CVD under following conditions:

| | |
|---|---|
| Material gases: | $SiH_4$, $O_2$, $PH_3$, |
| Substrate temperature: | 420° C. |
| Film thickness: | 600 mm |

Observation by a scanning electron microscopy revealed that the resulting first sacrificial layer 3 of $Y_1Ba_2Cu_3O_{7-x}$ (a surface of PSG sub-layer 33) has such a smooth surface that the maximum roughness is about 100 Å.

In the prior art, a first sacrificial layer 3 made of PSG alone formed on the same substrate showed the maximum roughness of more than 0.1 μm.

Then, polycrystalline silicon layer 4 was deposited by low-pressure CVD technique as is shown in FIG. 1D.

A pattern was formed by lithography and then the polycrystalline silicon layer 4 is processed by RIE technique as is shown in FIG. 1E.

Then, a second sacrificial layer 5 was formed as is shown in FIG. 1F. FIG. 2B illustrates an enlarged cross section of a part circled by II in FIG. 1F.

In this Example 3, the second sacrificial layer 5 consisted of three sub-layers of a lower sub-layer 51 made of $SiN_x$, an intermediate sub-layer 52 made of $Y_1Ba_2Cu_3O_{7-x}$ and an upper sub-layer 53 made of $SiN_x$. These sub-layers 51, 52, 53 were prepared as following:

The lower $SiN_x$ sub-layer 51 was deposited on the patterned polycrystalline silicon layer 4 and on the sacrificial layer 3 by plasma CVD under following conditions:

| | |
|---|---|
| Material gases: | SiH$_4$, NH$_3$, N$_2$ |
| Substrate temperature: | 350° C. |
| Pressure: | 200 m Torr |
| Film thickness: | 800 nm |

The intermediate sub-layer 52 made of Y$_1$Ba$_2$Cu$_3$O$_{7-x}$ was deposited by sputtering under following conditions:

| | |
|---|---|
| Sputtering gas: | Ar, O$_2$ |
| Substrate temperature: | 650° C. |
| Pressure: | 30 to 50 m Torr |
| Film thickness: | 100 nm |

The upper SiN$_x$ sub-layer 53 was deposited by by plasma CVD under following conditions:

| | |
|---|---|
| Material gases: | SiH$_4$, NH$_3$, N$_2$ |
| Substrate temperature: | 350° C. |
| Pressure: | 200 m Torr |
| Film thickness: | 800 nm |

Observation by a scanning electron microscopy revealed that the resulting second sacrificial layer 5 (a surface of SiN$_x$ sub-layer 53) also has a smooth surface.

Then, a pattern of resist was formed by lithography on the second sacrificial layer 5. This second sacrificial layer 5 was partly removed by reactive ion-etching technique as is shown in FIG. 1G.

Then, polycrystalline silicon layer 6 was deposited thereon by low-pressure CVD technique (FIG. 1H). A photo-resist layer is formed and then is patterned by lithography. After then, the polycrystalline silicon layer 6 was partly removed by RIE technique (FIG. 1I).

Finally, the first sacrificial layer 3 and the second sacrificial layer 5 were etched with aqueous solution of hydrogen chloride (1/1000) as is shown in FIG. 1J to produce a microgear 14 made of polycrystalline silicon rotatable-supported about a shaft 16 made of polycrystalline silicon.

Observation by a scanning electron microscopy revealed such a fact that no erosion or corrosion at edges was found in the resulting machine element fabricated by the process according to the present invention, while edges of a machine element fabricated by the prior art were etched and rounded.

Although the intermediate sub-layer of ceramic material in the Example 3 was prepared by sputtering, the sub-layer can be prepared by any known technique such as CVD.

We claim:

1. A process for manufacturing a micromachine comprising a machine element supported on a substrate, comprising the steps of:
   (a) successively depositing on the substrate machine part layers and removable sacrificial layers made of an oxide ceramic material containing a rare earth, Ba, and Cu, and
   (b) partially removing said sacrificial layers and said machine parts layers so as to leave said machine element.

2. The process as set forth in claim 1 wherein at least one of said sacrificial layers is made of an oxide represented by the general formula:

Re$_1$Ba$_2$Cu$_3$O$_{7-x}$ in which Re stands for rare earth elements and x is a number of ±1.

3. A process as set forth in claim 1, wherein at least one of said sacrificial layers made from said oxide ceramic material, comprises a plurality of sub-layers.

4. A process as set forth in claim 3, wherein the plurality of sub-layers contains a top and bottom sub-layer wherein the top sub-layer and/or the bottom sub-layer are made of an oxide ceramic material containing rare earth, Ba, and Cu.

5. A process as set forth in claim 4, wherein said top sub-layer and/or said bottom sub-layer are made of an oxide represented by the general formula:

Re$_1$Ba$_2$Cu$_3$O$_{7-x}$ in which Re stands for rare earth elements and x is a number of ±1.

6. A process as set forth in claim 4, wherein the plurality of sub-layers contains at least one sub-layer other than said top sub-layer and said bottom sub-layer which is made of silicon nitride or phosphor silicate glass.

7. A process as set forth in claim 3, wherein the plurality of sub-layers contain a top and bottom sub-layer and at least one intermediate layer, wherein the top sub-layer and the bottom sub-layer are made of a material which does not adversely affect the materials of which said substrate and said machine element are made, and at least one of the intermediate sub-layers is made of an oxide ceramic material containing rare earth, Ba, and Cu.

8. A process as set forth in claim 7, wherein at least one of said intermediate sub-layers is made of an oxide represented by the general formula:

Re$_1$Ba$_2$Cu$_3$O$_{7-x}$ in which Re stands for rare earth elements and x is a number of ±1.

9. A process as set forth in claim 7, wherein said top sub-layer and bottom sub-layer in said sacrificial sub-layers are independently made of silicon nitride or phosphor silicate glass.

10. A process as set forth in claim 1, wherein said machine element is made of polycrystalline silicon.

11. A process as set forth in claim 1, wherein said machine element is rotatable-supported by a stationary shaft made of polycrystalline silicon and secured to said substrate.

12. A process as set forth in claim 11, wherein said stationary shaft has flanges made of polycrystalline silicon at opposite ends.

13. A process as set forth in claim 1, wherein said machine element is a micro gear.

14. A process as set forth in claim 1, wherein deposition of said machine parts layer and removable sacrificial layers is effected by at least one technique selected from the group consisting of low-pressure chemical vapour deposition plasma chemical vapour deposition, and sputtering.

15. A process as set forth in claim 1, wherein selective removal of said machine parts layers and removable sacrificial layers is effected by photo-lithography followed by reactive ion etching.

16. A process as set forth in claim 1, wherein said substrate is a silicon single crystal substrate.

17. A process as claimed in claim 1, wherein the rare earth is selected from the group consisting of Y, Dy, and Ho.

18. A process as claimed in claim 17, wherein the rare earth is yttrium.

19. A process as claimed in claim 2, wherein Re is Y.

20. A micromachine produced by a process as claimed in claim 1.

* * * * *